(12) United States Patent
Li

(10) Patent No.: US 10,571,754 B2
(45) Date of Patent: Feb. 25, 2020

(54) LIQUID CRYSTAL DISPLAY DEVICE

(71) Applicant: Shenzhen China Star Optoelectronics Semiconductor Display Technology Co., Ltd., Shenzhen (CN)

(72) Inventor: Wenying Li, Shenzhen (CN)

(73) Assignee: Shenzhen China Star Optoelectronics Semiconductor Display Technology Co., LTD., Guangdong (CN)

( * ) Notice: Subject to any disclaimer, the term of this patent is extended or adjusted under 35 U.S.C. 154(b) by 0 days.

(21) Appl. No.: 15/746,429

(22) PCT Filed: Jan. 12, 2018

(86) PCT No.: PCT/CN2018/072466
§ 371 (c)(1),
(2) Date: Jan. 22, 2018

(87) PCT Pub. No.: WO2019/127666
PCT Pub. Date: Jul. 4, 2019

(65) Prior Publication Data
US 2019/0204689 A1    Jul. 4, 2019

(51) Int. Cl.
*H01L 27/12* (2006.01)
*G02F 1/1343* (2006.01)
*G02F 1/1368* (2006.01)

(52) U.S. Cl.
CPC ...... *G02F 1/134309* (2013.01); *G02F 1/1368* (2013.01); *H01L 27/124* (2013.01); *G02F 2001/134345* (2013.01); *G02F 2201/123* (2013.01)

(58) Field of Classification Search
None
See application file for complete search history.

(56) References Cited

U.S. PATENT DOCUMENTS

| | | | | |
|---|---|---|---|---|
| 6,452,657 B1* | 9/2002 | Suzuki | ............... | G02F 1/134363 349/141 |
| 7,989,274 B2* | 8/2011 | Kang | .................... | G02F 1/1333 438/149 |
| 8,269,935 B2* | 9/2012 | Kuo | .................. | G02F 1/133707 349/114 |
| 8,599,349 B2* | 12/2013 | Chang | .................... | G02F 1/1362 349/141 |
| 10,249,646 B2* | 4/2019 | Kim | ..................... | H01L 27/1259 |
| 2002/0101557 A1* | 8/2002 | Ono | .................. | G02F 1/134363 349/143 |

(Continued)

*Primary Examiner* — Bilkis Jahan
(74) *Attorney, Agent, or Firm* — Mark M. Friedman

(57) ABSTRACT

The present disclosure provides a liquid crystal display device including a plurality of pixels arranged in an array, each of the pixels comprising: a first pixel region and a second pixel region aligned vertically with the first pixel region. Any two adjacent pixels in the same row have structures being mirror-symmetric with respect to each other. And, for any two adjacent rows of pixels, a structure of the $m^{th}$ pixel in the $(N+1)^{th}$ row and a structure of the $(m+1)^{th}$ pixel in the $N^{th}$ row are the same, where N and M are natural numbers.

12 Claims, 5 Drawing Sheets

(56) References Cited

U.S. PATENT DOCUMENTS

2003/0193625 A1* 10/2003 Yoshida ............ G02F 1/134336
  349/43
2016/0131951 A1* 5/2016 Lee ................... G02F 1/136213
  349/39

* cited by examiner

LIQUID CRYSTAL DISPLAY DEVICE

FIELD OF INVENTION

The present disclosure relates to the field of display technology, and more particularly to a liquid crystal display device.

BACKGROUND

Liquid crystal displays (LCDs) are light weight and have a thin volume among various types of flat panel displays, therefore LCDs have gradually become a mainstream flat panel display. Nevertheless, compared to cathode ray tube (CRT) displays, LCDs have narrower viewing angles, making LCDs limited in application of fields requiring wide viewing angles, such as aviation and medical fields.

For this reason, multi-domain vertical alignment (MVA) technique and in plane switching (IPS) technique are employed to realize wide viewing angles. As shown in FIG. 1, for an LCD where MVA technique is employed, each pixel 1 includes a connection end 2 used for connecting to a drain electrode of thin-film transistor (TFT). Each pixel 1 further includes a striped vertical bar 3, a striped horizontal bar 4, and a plurality of striped branches 5 angled with respect to the horizontal bar 4. The vertical bar 3 and the horizontal bar 4 intersect with each other at midpoints thereof, such that the vertical bar 3 is perpendicular to the horizontal bar 4, and the pixel is divided into four regions. Each region includes plural striped branches 5 angled with respect to the horizontal bar 4. In the LCD as shown in FIG. 1, however, there will be swirling liquid crystal vortex areas generated at edges of the vertical bar 3 and the horizontal bar 4, resulting in poor display quality of LCD.

SUMMARY OF DISCLOSURE

The present disclosure is aimed to provide a liquid crystal display device, where viewing angle is widened.

In one aspect, the present disclosure provides a liquid crystal display device comprising a plurality of pixels arranged in an array, each of the pixels comprising:

a first pixel region, wherein the first pixel region includes a first pixel electrode, the first pixel electrode includes a plurality of first branch electrodes and a first connection portion connected to one end of each of the first branch electrodes, and the other end of each of the first branch electrodes extends outwardly in a first predetermined angle along a first predetermined direction; and a second pixel region, wherein the second pixel region is aligned vertically with the first pixel region, the second pixel region includes a second pixel electrode, the second pixel electrode includes a plurality of second branch electrodes and a second connection portion connected to one end of each of the second branch electrodes, and the other end of each of the second branch electrodes extends outwardly in a second predetermined angle along a second predetermined direction;

wherein any two adjacent pixels in the same row have structures being mirror-symmetric with respect to each other; and for any two adjacent rows of pixels, a structure of the $m^{th}$ pixel in the $(N+1)^{th}$ row and a structure of the $(m+1)^{th}$ pixel in the $N^{th}$ row are the same, where N and M are natural numbers;

wherein the first connection portion is L-shaped, and the second connection portion is L-shaped; and wherein the first pixel region is disposed above the second pixel region, or the first pixel region is disposed below the second pixel region.

In some embodiments, the first connection portion is disposed at an upper right corner of the first pixel region, and the second connection portion is disposed at a lower left corner of the second pixel region.

In some embodiments, the first connection portion is disposed at an upper right corner of the first pixel region, and the second connection portion is disposed at a lower right corner of the second pixel region.

In some embodiments, the first connection portion is disposed at a lower right corner of the first pixel region, and the second connection portion is disposed at an upper left corner of the second pixel region.

In some embodiments, the first connection portion is disposed at a lower right corner of the first pixel region, and the second connection portion is disposed at an upper right corner of the second pixel region.

In some embodiments, the first pixel electrode further includes a first connection end, and the second pixel electrode further includes a second connection end; the first pixel region further includes a first thin-film transistor, and the second pixel region further includes a second thin-film transistor; and the first pixel electrode is connected to a drain electrode of the first thin-film transistor via the first connection end, and the second pixel electrode is connected to a drain electrode of the second thin-film transistor via the second connection end.

In some embodiments, the first connection end is connected to the first connection portion, or the first connection end is connected to the first branch electrodes; and the second connection end is connected to the second connection portion, or the second connection end is connected to the second branch electrodes.

In some embodiments, an area ratio of the first pixel region to the second pixel region is ranged from 0.2 to 5.

In another aspect, the present disclosure provides a liquid crystal display device comprising a plurality of pixels arranged in an array, each of the pixels comprising:

a first pixel region, wherein the first pixel region includes a first pixel electrode, the first pixel electrode includes a plurality of first branch electrodes and a first connection portion connected to one end of each of the first branch electrodes, and the other end of each of the first branch electrodes extends outwardly in a first predetermined angle along a first predetermined direction; and a second pixel region, wherein the second pixel region is aligned vertically with the first pixel region, the second pixel region includes a second pixel electrode, the second pixel electrode includes a plurality of second branch electrodes and a second connection portion connected to one end of each of the second branch electrodes, and the other end of each of the second branch electrodes extends outwardly in a second predetermined angle along a second predetermined direction;

wherein any two adjacent pixels in the same row have structures being mirror-symmetric with respect to each other; and for any two adjacent rows of pixels, a structure of the $m^{th}$ pixel in the $(N+1)^{th}$ row and a structure of the $(m+1)^{th}$ pixel in the $N^{th}$ row are the same, where N and M are natural numbers.

In some embodiments, the first connection portion is L-shaped, and the second connection portion is L-shaped.

In some embodiments, the first connection portion is disposed at an upper right corner of the first pixel region, and the second connection portion is disposed at a lower left corner of the second pixel region.

In some embodiments, the first connection portion is disposed at an upper right corner of the first pixel region, and the second connection portion is disposed at a lower right corner of the second pixel region.

In some embodiments, the first connection portion is disposed at a lower right corner of the first pixel region, and the second connection portion is disposed at an upper left corner of the second pixel region.

In some embodiments, the first connection portion is disposed at a lower right corner of the first pixel region, and the second connection portion is disposed at an upper right corner of the second pixel region.

In some embodiments, the first pixel electrode further includes a first connection end, and the second pixel electrode further includes a second connection end; the first pixel region further includes a first thin-film transistor, and the second pixel region further includes a second thin-film transistor; and the first pixel electrode is connected to a drain electrode of the first thin-film transistor via the first connection end, and the second pixel electrode is connected to a drain electrode of the second thin-film transistor via the second connection end.

In some embodiments, the first connection end is connected to the first connection portion, or the first connection end is connected to the first branch electrodes; and the second connection end is connected to the second connection portion, or the second connection end is connected to the second branch electrodes.

In some embodiments, an area ratio of the first pixel region to the second pixel region is ranged from 0.2 to 5.

In some embodiments, the first pixel region is disposed above the second pixel region, or the first pixel region is disposed below the second pixel region.

Compared to the conventional liquid crystal display device, the liquid crystal display device of the present disclosure is characterized by dividing each pixel to include a first pixel region and a second pixel region, in which viewing angle of display device is widened by coordination of the two pixel regions. Since any two adjacent pixels in the same row have structures being mirror-symmetric with respect to each other, and for any two adjacent rows of pixels, a structure of the $m^{th}$ pixel in the $(N+1)^{th}$ row and a structure of the $(m+1)^{th}$ pixel in the $N^{th}$ row are the same, where N and M are natural numbers, viewing angle of display device is widened.

To explain in detail the above summarized description of the subject invention, preferred embodiments are provided in conjunction with the drawings below.

DETAILED DESCRIPTION

Figure 1:
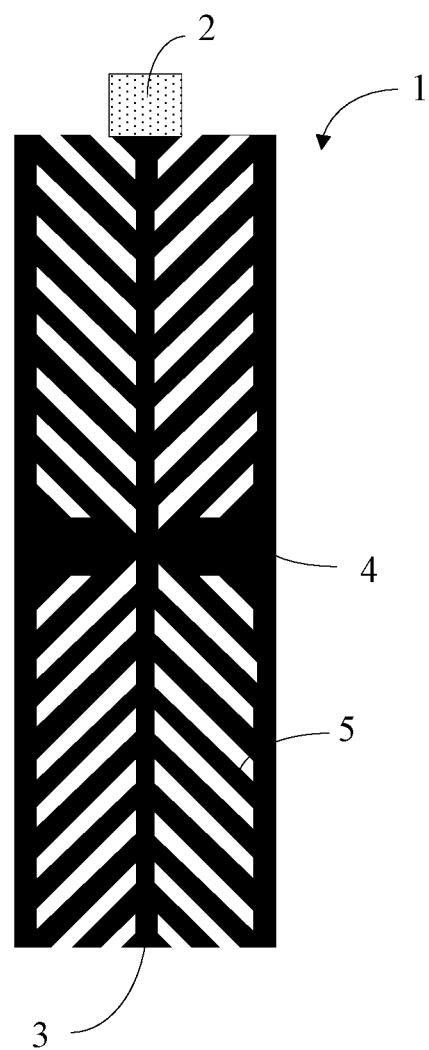
FIG. 1 is a schematic diagram showing a structure of a pixel according to the prior art.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto.

In the drawings, the same reference symbol represents the same or similar components.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment, nor an independent or unique embodiment that is incompatible with other embodiments. It should be appreciated by any person having ordinary skill in the art that any embodiment referred in the specification can combine with other embodiment in the specification.

The present disclosure provides a liquid crystal display device. Please refer to FIG. 3, which is a schematic diagram showing a structure of a liquid crystal display device according to one embodiment of the present disclosure. The liquid crystal display device 1000 includes a plurality of pixels 10 arranged in an array. The pixels 10 can be red pixels, blue pixels, or green pixels that are arranged sequentially and repeatedly.

Each of the pixels 10 includes a first pixel region 11 and a second pixel region 12, wherein the second pixel region is aligned vertically with the first pixel region. The first pixel region 11 could function as a primary pixel region, and the second pixel region 12 could function as a secondary pixel region which assists the first pixel region 11 in improving viewing angles and color shift of LCD device. An area ratio of the first pixel region 11 to the second pixel region 12 is ranged from 0.2 to 5.

Figure 2:
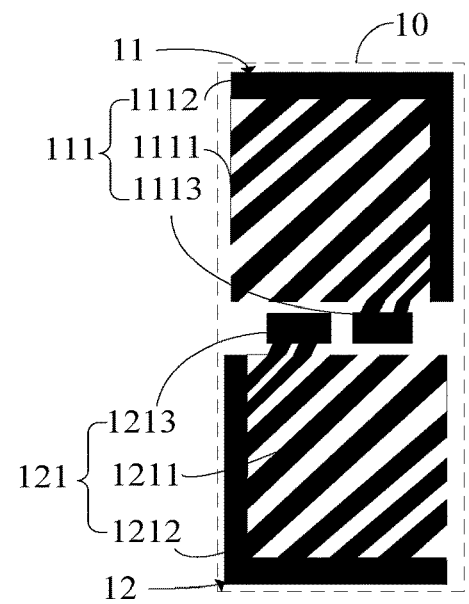
FIG. 2 is a schematic diagram showing a first structure of a pixel according to one embodiment of the present disclosure.

In some embodiments, as shown in FIG. 2, the first pixel region 11 is disposed above the second pixel region 12. In other embodiments, the first pixel region 11 is disposed below the second pixel region 12.

The first pixel region 11 includes a first pixel electrode 111 and a first thin-film transistor (TFT). Specifically, the first pixel electrode 111 includes a plurality of first branch electrodes 1111 and a first connection portion 1112. Likewise, the second pixel region 12 includes a second pixel electrode 121 and a second thin-film transistor (TFT). Specifically, the second pixel electrode 121 includes a plurality of second branch electrodes 1211 and a second connection portion 1212.

Each of the first branch electrodes 1111 includes two ends, where one end is connected to the first connection portion 1112, and the other end extends outwardly in a first predetermined angle along a first predetermined direction. As shown in FIG. 2, the upper right end of each of the first branch electrodes 1111 is connected to the first connection portion 1112, and the lower left end of each of the first branch electrodes 1111 extends outwardly in a first predetermined angle along a first predetermined direction. Likewise, each of the second branch electrodes 1211 also includes two ends, where one end is connected to the second connection portion 1212, and the other end extends outwardly in a second predetermined angle along a second predetermined direction. As shown in FIG. 2, the lower left end of each of the second branch electrodes 1211 is connected to the second connection portion 1212, and the upper right end of each of the second branch electrodes 1211 extends outwardly in a second predetermined angle along a second predetermined direction. The first predetermined direction and the second predetermined direction could be a direction that is horizontal or vertical. The first predetermined angle and the second predetermined angle could be 30, 40, or 45 degrees, but are not limited thereto. Preferably, the second predetermined angle could be the same as or different from the first predetermined angle. The second predetermined direction could be identical to the first predetermined direction.

The first pixel electrode further includes a first connection end, and the second pixel electrode further includes a second connection end. The first pixel electrode is connected to a drain electrode of the first thin-film transistor via the first connection end, and the second pixel electrode is connected to a drain electrode of the second thin-film transistor via the second connection end. Specifically, as shown in FIGS. 2-9, the first connection end 1113 and the second connection end 1213 are disposed between the first pixel region 11 and the second pixel region 12.

As shown in FIGS. 2-9, the first connection portion 1112 is L-shaped and is connected to the first branch electrodes 1111, and the second connection portion 1212 is L-shaped and is connected to the second branch electrodes 1211.

In some embodiments, as shown in FIG. 2, the first connection portion 1112 is disposed at the upper right corner of the first pixel region 11, i.e. being disposed at upper edge and right edge of the first pixel region 11, and is connected to the upper right end of each of the first branch electrode 1111. The second connection portion 1212 is disposed at the lower left corner of the second pixel region 12, i.e. being disposed at lower edge and left edge of the second pixel region 12, and is connected to the lower left end of each of the second branch electrode 1211. Additionally, as shown in FIG. 2, the first connection end 1113 is directly connected to the first branch electrodes 1111, and the second connection end 1213 is directly connected to the second branch electrodes 1211.

Figure 3:
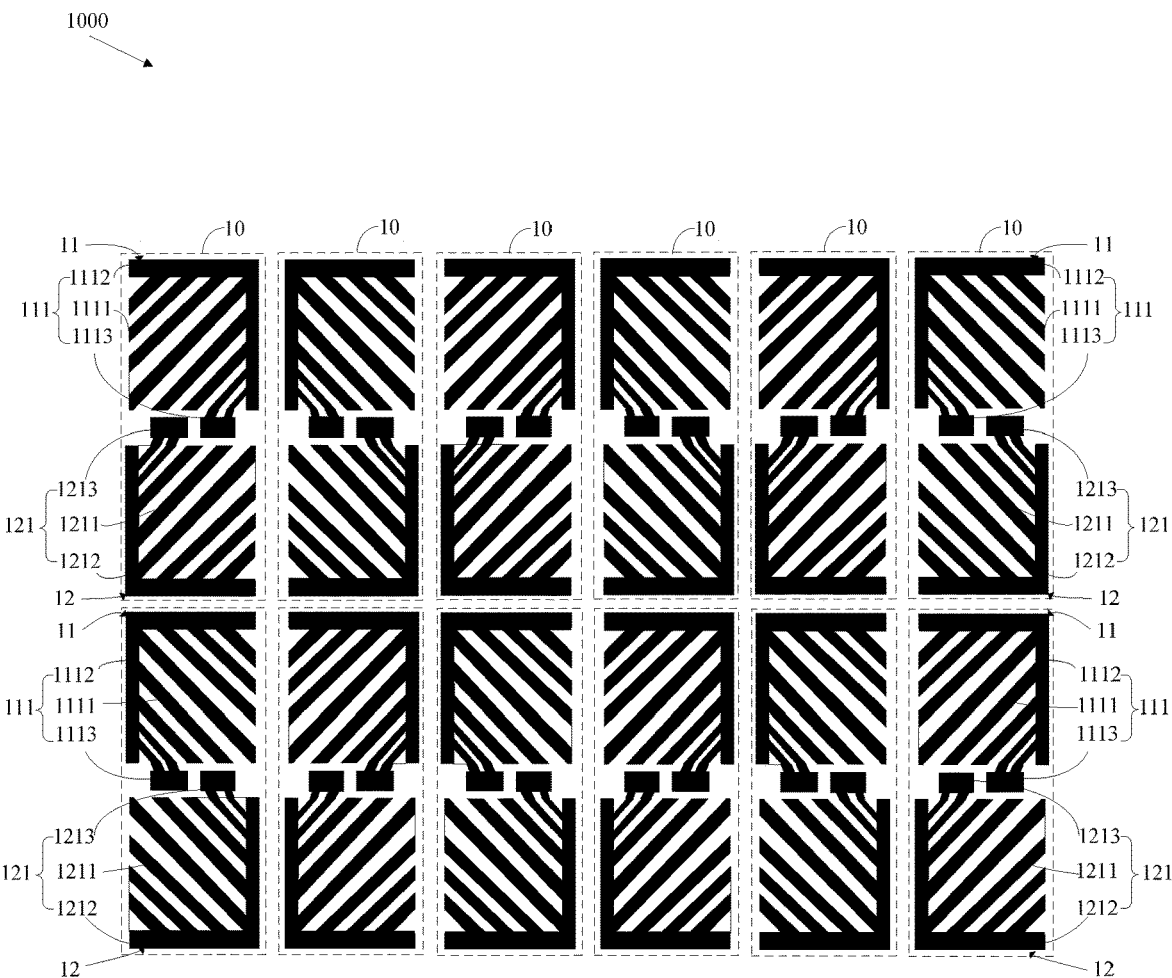
FIG. 3 is a schematic diagram showing a first structure of a liquid crystal display device according to one embodiment of the present disclosure.

A plurality of pixels having the structure as shown in FIG. 2 can be arranged to form the arrangement shown in FIG. 3 in the LCD device. As shown in FIG. 3, in the LCD device 1000, a plurality of pixels 10 are arranged in an array, such that any two adjacent pixels 10 in the same row have structures being mirror-symmetric with respect to each other. Moreover, for any two adjacent rows of pixels, a structure of the $m^{th}$ pixel in the $(N+1)^{th}$ row and a structure of the $(m+1)^{th}$ pixel in the $N^{th}$ row are the same, where N and M are natural numbers. With such an arrangement, not only compensation of viewing angle is accomplished but viewing angle of display device is widened.

Figure 4:
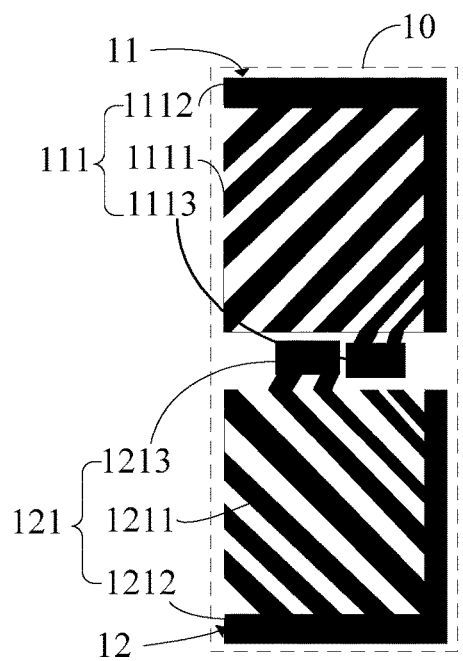
FIG. 4 is a schematic diagram showing a second structure of a pixel according to one embodiment of the present disclosure.

In some embodiments, as shown in FIG. 4, the first connection portion 1112 is disposed at the upper right corner of the first pixel region 11, i.e. being disposed at upper edge and right edge of the first pixel region 11, and is connected to the upper right end of each of the first branch electrode 1111. The second connection portion 1212 is disposed at the lower right corner of the second pixel region 12, i.e. being disposed at lower edge and right edge of the second pixel region 12, and is connected to the lower right end of each of the second branch electrode 1211. Additionally, as shown in FIG. 4, the first connection end 1113 is directly connected to the first branch electrodes 1111, and the second connection end 1213 is directly connected to the second branch electrodes 1211.

Figure 5:
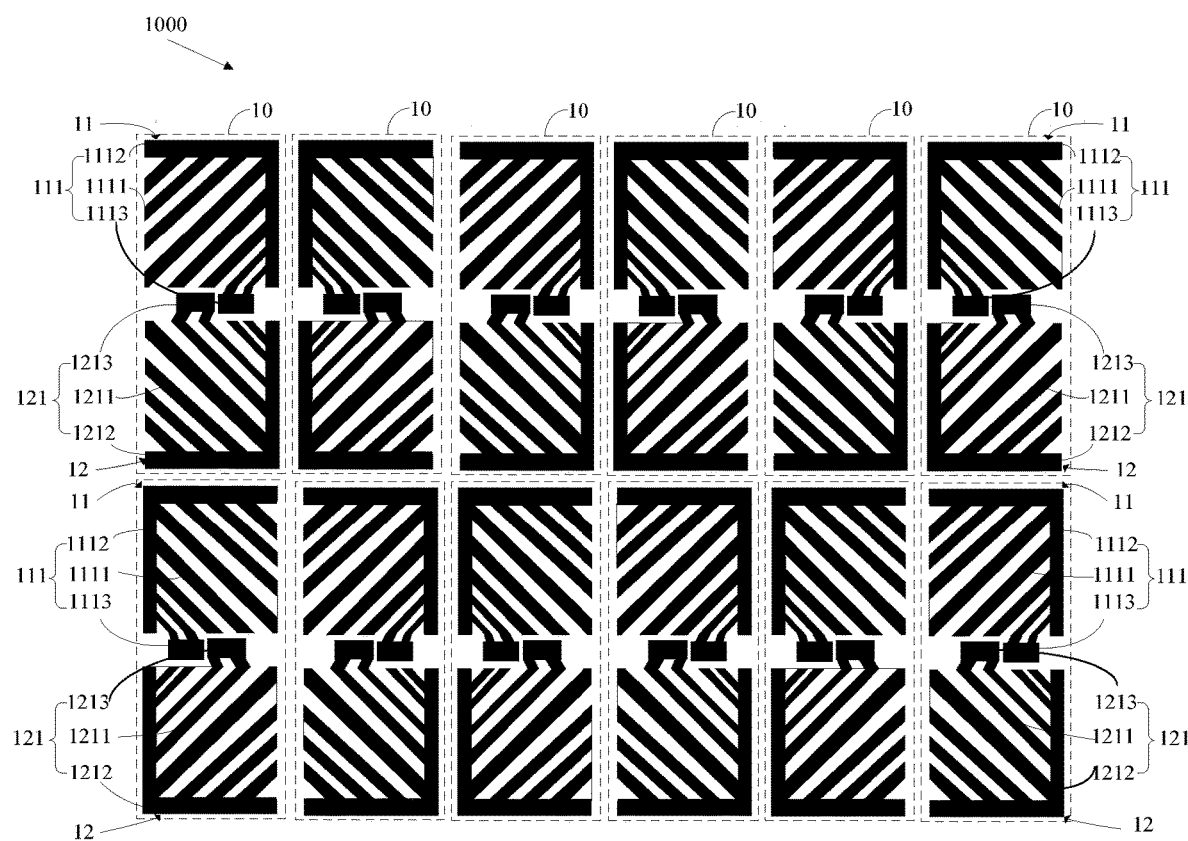
FIG. 5 is a schematic diagram showing a second structure of a liquid crystal display device according to one embodiment of the present disclosure.

A plurality of pixels having the structure as shown in FIG. 4 can be arranged to form the arrangement shown in FIG. 5 in the LCD device 1000. As shown in FIG. 5, in the LCD device 1000, a plurality of pixels 10 are arranged in an array, such that any two adjacent pixels 10 in the same row have structures being mirror-symmetric with respect to each other. Moreover, for any two adjacent rows of pixels, a structure of the $m^{th}$ pixel in the $(N+1)^{th}$ row and a structure of the $(m+1)^{th}$ pixel in the $N^{th}$ row are the same, where N and M are natural numbers. With such an arrangement, not only compensation of viewing angle is accomplished but viewing angle of display device is widened.

Figure 6:
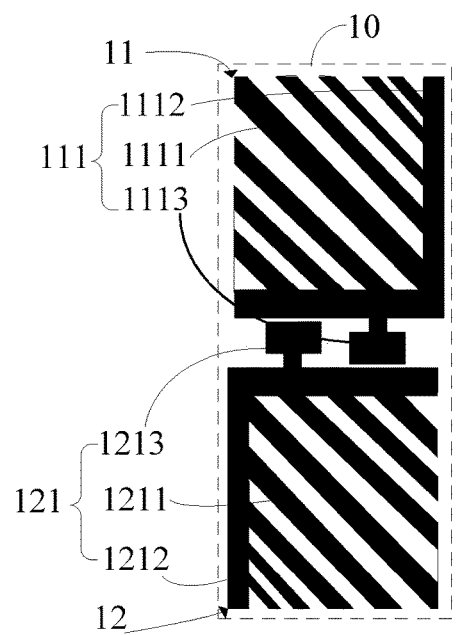
FIG. 6 is a schematic diagram showing a third structure of a pixel according to one embodiment of the present disclosure.

In some embodiments, as shown in FIG. 6, the first connection portion 1112 is disposed at the lower right corner of the first pixel region 11, i.e. being disposed at lower edge and right edge of the first pixel region 11, and is connected to the lower right end of each of the first branch electrode 1111. The second connection portion 1212 is disposed at the upper left corner of the second pixel region 12, i.e. being disposed at upper edge and left edge of the second pixel region 12, and is connected to the upper left end of each of the second branch electrode 1211. Additionally, as shown in FIG. 6, the first connection end 1113 is connected to the first connection portion 1112, and the second connection end 1213 is connected to the second connection portion 1212.

Figure 7:
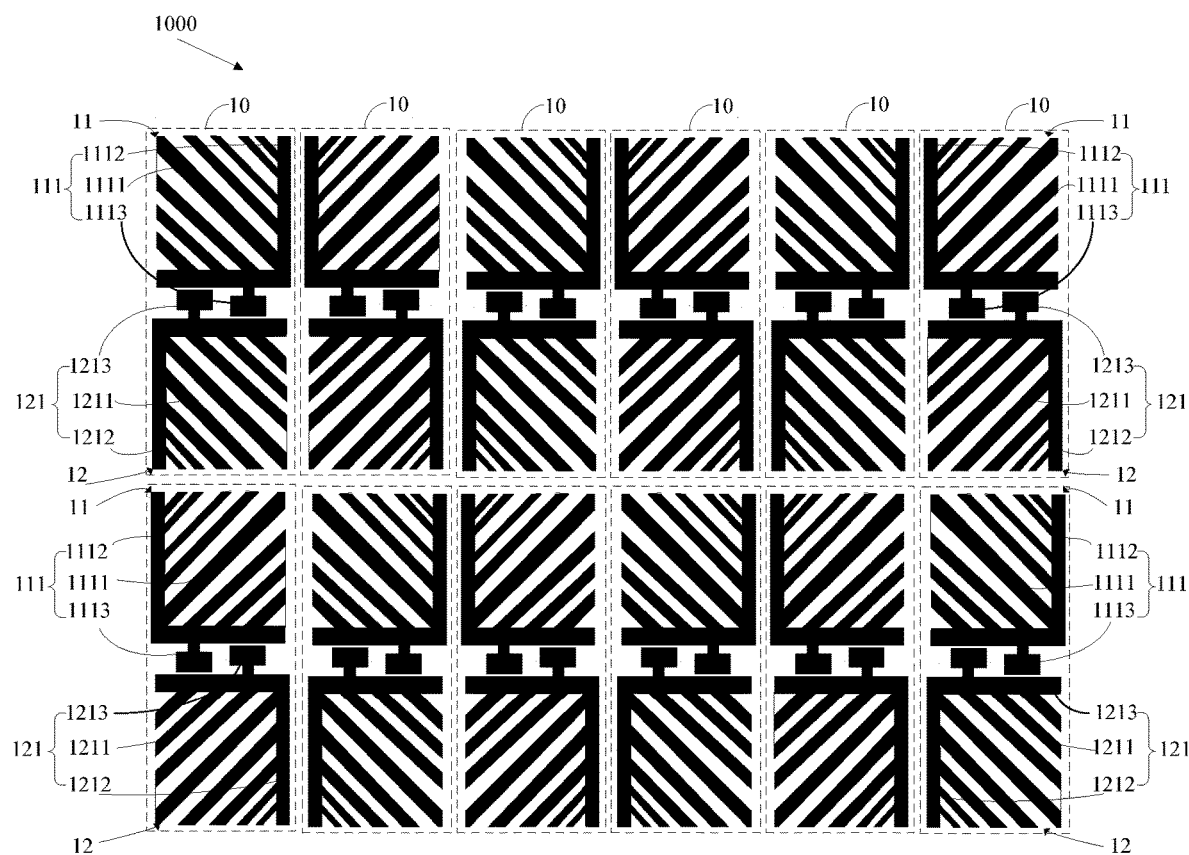
FIG. 7 is a schematic diagram showing a third structure of a liquid crystal display device according to one embodiment of the present disclosure.

A plurality of pixels having the structure as shown in FIG. 6 can be arranged to form the arrangement shown in FIG. 7 in the LCD device 1000. As shown in FIG. 7, in the LCD device 1000, a plurality of pixels 10 are arranged in an array, such that any two adjacent pixels 10 in the same row have structures being mirror-symmetric with respect to each other. Moreover, for any two adjacent rows of pixels, a structure of the $m^{th}$ pixel in the $(N+1)^{th}$ row and a structure of the $(m+1)^{th}$ pixel in the $N^{th}$ row are the same, where N and M are natural numbers. With such an arrangement, not only compensation of viewing angle is accomplished but viewing angle of display device is widened.

Figure 8:
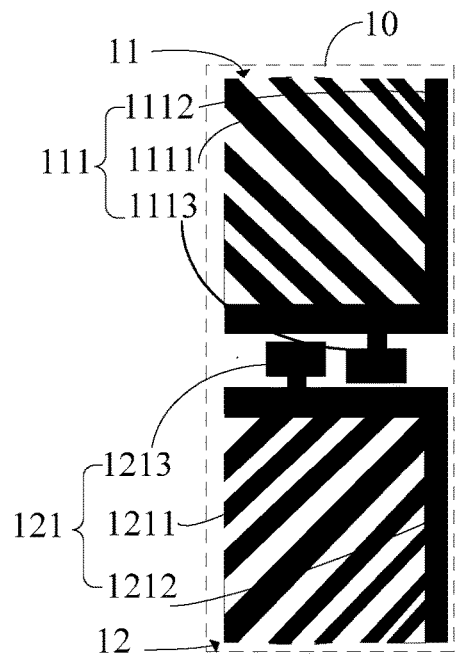
FIG. 8 is a schematic diagram showing a fourth structure of a pixel according to one embodiment of the present disclosure.

In some embodiments, as shown in FIG. 8, the first connection portion 1112 is disposed at the lower right corner of the first pixel region 11, i.e. being disposed at lower edge and right edge of the first pixel region 11, and is connected to the lower right end of each of the first branch electrode 1111. The second connection portion 1212 is disposed at the upper right corner of the second pixel region 12, i.e. being disposed at upper edge and right edge of the second pixel region 12, and is connected to the upper right end of each of the second branch electrode 1211. Additionally, as shown in FIG. 8, the first connection end 1113 is connected to the first connection portion 1112, and the second connection end 1213 is connected to the second connection portion 1212.

Figure 9:
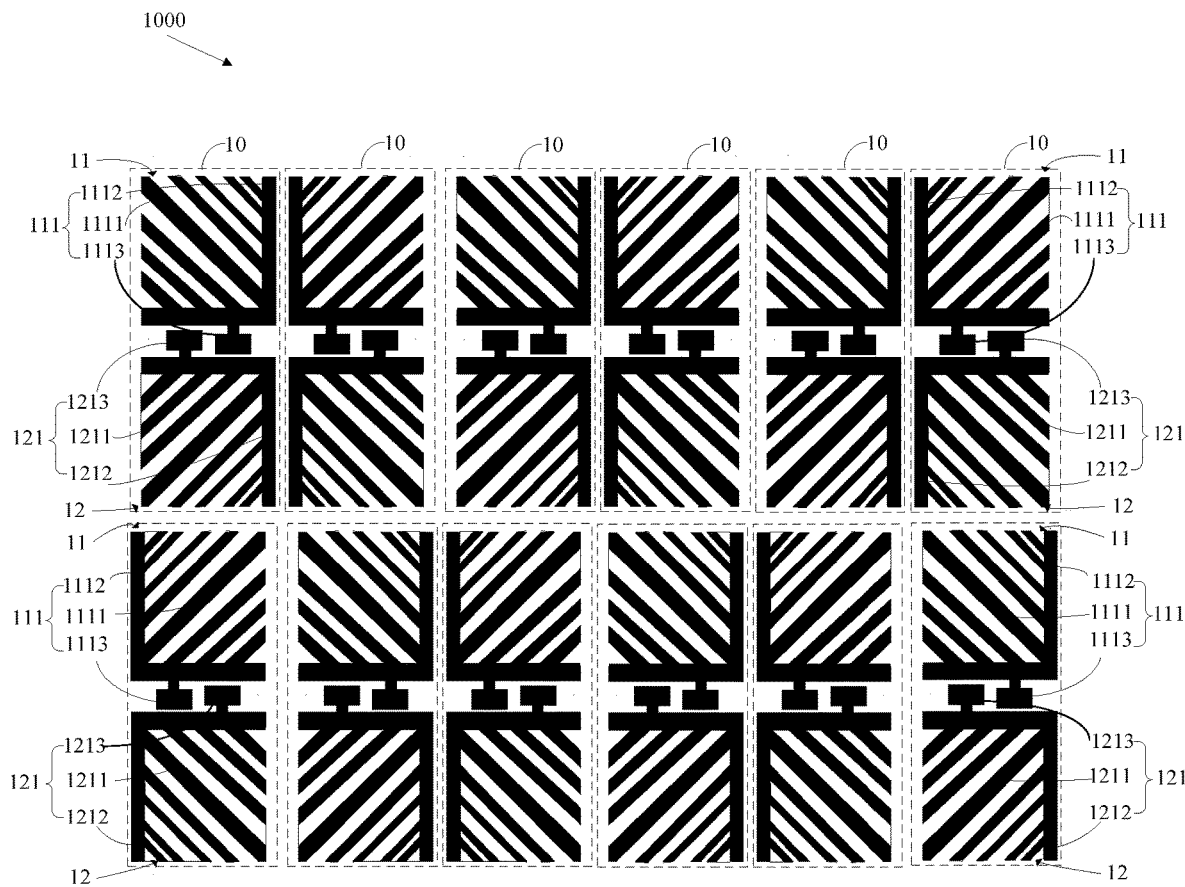
FIG. 9 is a schematic diagram showing a fourth structure of a liquid crystal display device according to one embodiment of the present disclosure.

A plurality of pixels having the structure as shown in FIG. 8 can be arranged to form the arrangement shown in FIG. 9 in the LCD device 1000. As shown in FIG. 9, in the LCD device 1000, a plurality of pixels 10 are arranged in an array, such that any two adjacent pixels 10 in the same row have structures being mirror-symmetric with respect to each other. Moreover, for any two adjacent rows of pixels, a structure of the $m^{th}$ pixel in the $(N+1)^{th}$ row and a structure of the $(m+1)^{th}$ pixel in the $N^{th}$ row are the same, where N and M are natural numbers. With such an arrangement, not only compensation of viewing angle is accomplished but viewing angle of display device is widened.

According to the liquid crystal display device of the present disclosure, each pixel is divided to include a first pixel region and a second pixel region, in which viewing angle of display device is widened by coordination of the two pixel regions. Since any two adjacent pixels in the same row have structures being mirror-symmetric with respect to each other, and for any two adjacent rows of pixels, a structure of the $m^{th}$ pixel in the $(N+1)^{th}$ row and a structure of the $(m+1)^{th}$ pixel in the $N^{th}$ row are the same, where N and M are natural numbers, viewing angle of display device is widened.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A liquid crystal display device comprising a plurality of pixels arranged in an array, each of the pixels comprising:
    a first pixel region, wherein the first pixel region includes a first pixel electrode, the first pixel electrode includes a plurality of first branch electrodes and a first connection portion connected to one end of each of the first branch electrodes, and the other end of each of the first branch electrodes extends outwardly in a first predetermined angle along a first predetermined direction; and
    a second pixel region, wherein the second pixel region is aligned vertically with the first pixel region, the second pixel region includes a second pixel electrode, the second pixel electrode includes a plurality of second branch electrodes and a second connection portion connected to one end of each of the second branch electrodes, and the other end of each of the second branch electrodes extends outwardly in a second predetermined angle along a second predetermined direction;
    wherein any two adjacent pixels in the same row have structures being mirror-symmetric with respect to each other; and for any two adjacent rows of pixels, a structure of the $m^{th}$ pixel in the $(N+1)^{th}$ row and a structure of the $(m+1)^{th}$ pixel in the $N^{th}$ row are the same, where N and M are natural numbers;
    wherein the first connection portion is L-shaped, and the second connection portion is L-shaped;
    wherein the first pixel region is disposed above the second pixel region, or the first pixel region is disposed below the second pixel region; and
    wherein the first pixel electrode and the second pixel electrode are physically and electrically separated from each other.

2. The liquid crystal display device according to claim 1, wherein the first connection portion is disposed at an upper right corner of the first pixel region, and the second connection portion is disposed at a lower left corner of the second pixel region.

3. The liquid crystal display device according to claim 1, wherein
    the first pixel electrode further includes a first connection end, and the second pixel electrode further includes a second connection end;
    the first pixel region further includes a first thin-film transistor, and the second pixel region further includes a second thin-film transistor; and
    the first pixel electrode is connected to a drain electrode of the first thin-film transistor via the first connection end, and the second pixel electrode is connected to a drain electrode of the second thin-film transistor via the second connection end.

4. The liquid crystal display device according to claim 3, wherein
    the first connection end is connected to the first branch electrodes; and
    the second connection end is connected to the second branch electrodes.

5. The liquid crystal display device according to claim 1, wherein an area ratio of the first pixel region to the second pixel region is ranged from 0.2 to 5.

6. A liquid crystal display device comprising a plurality of pixels arranged in an array, each of the pixels comprising:
    a first pixel region, wherein the first pixel region includes a first pixel electrode, the first pixel electrode includes a plurality of first branch electrodes and a first connection portion connected to one end of each of the first branch electrodes, and the other end of each of the first branch electrodes extends outwardly in a first predetermined angle along a first predetermined direction; and
    a second pixel region, wherein the second pixel region is aligned vertically with the first pixel region, the second pixel region includes a second pixel electrode, the second pixel electrode includes a plurality of second branch electrodes and a second connection portion connected to one end of each of the second branch electrodes, and the other end of each of the second branch electrodes extends outwardly in a second predetermined angle along a second predetermined direction;
    wherein any two adjacent pixels in the same row have structures being mirror-symmetric with respect to each other; and for any two adjacent rows of pixels, a structure of the $m^{th}$ pixel in the $(N+1)^{th}$ row and a structure of the $(m+1)^{th}$ pixel in the $N^{th}$ row are the same, where N and M are natural numbers; and
    wherein the first pixel electrode and the second pixel electrode are physically and electrically separated from each other.

7. The liquid crystal display device according to claim 6, wherein the first connection portion is L-shaped, and the second connection portion is L-shaped.

8. The liquid crystal display device according to claim 7, wherein the first connection portion is disposed at an upper right corner of the first pixel region, and the second connection portion is disposed at a lower left corner of the second pixel region.

9. The liquid crystal display device according to claim 6, wherein
    the first pixel electrode further includes a first connection end, and the second pixel electrode further includes a second connection end;

the first pixel region further includes a first thin-film transistor, and the second pixel region further includes a second thin-film transistor; and the first pixel electrode is connected to a drain electrode of the first thin-film transistor via the first connection end, and the second pixel electrode is connected to a drain electrode of the second thin-film transistor via the second connection end.

10. The liquid crystal display device according to claim 9, wherein the first connection end is connected to the first branch electrodes; and the second connection end is connected to the second branch electrodes.

11. The liquid crystal display device according to claim 6, wherein an area ratio of the first pixel region to the second pixel region is ranged from 0.2 to 5.

12. The liquid crystal display device according to claim 6, wherein the first pixel region is disposed above the second pixel region, or the first pixel region is disposed below the second pixel region.

\* \* \* \* \*

UNITED STATES PATENT AND TRADEMARK OFFICE
CERTIFICATE OF CORRECTION

PATENT NO. : 10,571,754 B2  
APPLICATION NO. : 15/746429  
DATED : February 25, 2020  
INVENTOR(S) : Wenying Li Page 1 of 1

It is certified that error appears in the above-identified patent and that said Letters Patent is hereby corrected as shown below:

On the Title Page

Item (30) Foreign Application Priority Data:
Change: (Absent information)
To: "December 29, 2017 (CN) 201711476040.3"

Signed and Sealed this
Twelfth Day of May, 2020

Andrei Iancu
*Director of the United States Patent and Trademark Office*